United States Patent [19]

Wasawa et al.

[11] 4,053,826
[45] Oct. 11, 1977

[54] APPARATUS FOR DETECTION OF ROTATIONAL ANGLE AND NUMBER OF ROTATIONS OF A ROTARY BODY

[75] Inventors: Kiyoshi Wasawa, Fujisawa; Toru Kita, Yokohama; Takao Sugisaki; Minoru Higurashi, both of Tokyo, all of Japan

[73] Assignees: TDK Electronics Co., Ltd., Tokyo; Nissan Motor Company, both of Japan

[21] Appl. No.: 671,983

[22] Filed: Mar. 30, 1976

[30] Foreign Application Priority Data

Apr. 4, 1975 Japan .................................. 50-40984

[51] Int. Cl.$^2$ ........................................... G01R 33/00
[52] U.S. Cl. ............................. 324/34 D; 324/34 PS; 73/136 A
[58] Field of Search ................... 324/173, 174, 34 D, 324/34 R, 34 GT, 179, 34 PS, 16 R, 16 S, 16 T; 33/1 PT; 73/136 A

[56] References Cited

U.S. PATENT DOCUMENTS

| 2,621,514 | 12/1952 | Waugh | 324/34 GT |
| 3,194,065 | 7/1965 | Wilson | 73/136 A |
| 3,573,619 | 4/1971 | Ivec | 324/174 |
| 3,673,584 | 6/1972 | Farrand | 324/34 D |
| 3,742,243 | 6/1973 | Gamble | 324/174 |
| 3,854,086 | 12/1974 | Watanabe | 324/34 PS |

Primary Examiner—M. Tokar
Attorney, Agent, or Firm—Burgess, Ryan and Wayne

[57] ABSTRACT

The specification discloses a first and a second rotary disk fixed together, each disk having a magnetic pole on its circumference, which disks rotate in the vicinity of a fixed magnetic head; the fixed magnetic head provides an electrical output signal each time a magnetic pole passes near it and, thus, said electrical output signal indicates a rotational angle and/or the number of rotations of said disk. Said magnetic head operates on a new principle developed from parametric excitation.

1 Claim, 6 Drawing Figures

APPARATUS FOR DETECTION OF ROTATIONAL ANGLE AND NUMBER OF ROTATIONS OF A ROTARY BODY

BACKGROUND OF THE INVENTION

The present invention relates to an apparatus which detects the rotational angle and/or the number of rotations of a rotary body, for example, the crankshaft of an automobile or other engines.

In the automobile industry, the problem of exhaust gas pollution is lately very serious, and for the solution of that problem, the fine control of an engine is desired. For the fine control, detection of the rotational angle and the number of rotations of a crankshaft and/or an engine-shaft is absolutely necessary.

Optical and electromagnetic systems have been proposed for detecting the rotational angle and the number of rotations of automotive rotary bodies. Recently proposed for this purpose are applications of the magnetic sensors using such semi-conductor elements as a Hall element, a magnetoresistance element, etc. The optical system is questionable as to its reliability in a vibration and dust environment, the electromagnetic system has the output voltage varied according to the speed of revolution of an engine, and the systems using semi-conductors are inferior in temperature characteristic, weak against impacts and expensive. Thus, a prior detector of the rotational angle and the number of rotations of the above-mentioned systems present difficulties in automotive use.

SUMMARY OF THE INVENTION

It is an object, therefore, of the present invention to overcome the disadvantage and limitation of a prior apparatus for detecting a rotational angle by providing a new and improved apparatus, which is excellent in temperature characteristics and external impact resistance, very simple in construction, low in production cost, is unaffected by an external magnetic field, and yet yields an output voltage of constant level without being affected by the speed of revolution of a rotary body. These objects are accomplished in accordance with the present invention by an apparatus for the detection of the rotational angle and the number of rotations of a rotary body comprising: (a) a fixed magnetic head assembly having a housing of magnetic shield material, a pair of head elements mounted in said housing, each of said elements having a wire, a layer of magnetic material of uni-axial magnetic anisotropic characteristics plated on said wire and a coil wound on said wire, said wire being connected to an exciting means of a predetermined frequency said layer of magnetic meterial having a hard magnetization axis in the direction of its axis and an easy magnetization axis in the circumferential direction, and a magnetic shield plate inserted between said pair of head elements; (b) a first rotary disk axially fixed to the rotary body, the circumference of said disk being arranged close to the first head element of said magnetic head, and said disk having a plurality of magnetic poles on its circumference so that N pole and S pole are mounted alternately; (c) a second rotary disk axially fixed to the rotary body, the circumference of the second disk being arranged close to the other head element of said magnetic head, and said disk having magnetic poles on its circumference, the number of magnetic poles being less than that of said first disk; (d) the winding of said first head element providing the electrical signal of frequency 2$f$ indicating the rotational angle of the rotary body relating to said first rotary disk and the winding of said second head element providing the electrical signal of frequency 2$f$ indicating the number of rotations of the rotary body relating to said second rotary disk.

BRIEF DESCRIPTION OF THE DRAWINGS

The foregoing and other objects, features, and attendant advantages of the present invention will be appreciated as the same become better understood by means of the following description and the accompanying drawings wherein.

DESCRIPTION OF THE PREFERRED EMBODIMENTS

The embodiment of the present apparatus which is applied for the detection of the rotational angle and the number of rotations of a crank-shaft will be explained.

Figure 1:
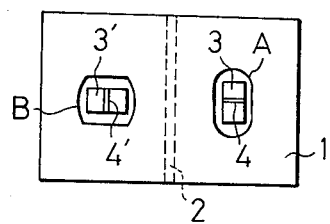
FIG. 1 shows the construction of a magnetic head according to the present invention.
Figure 2:
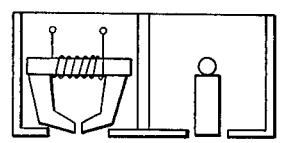
FIG. 2 shows the circuit diagram of the magnetic head shown in FIG. 1.
Figure 2:
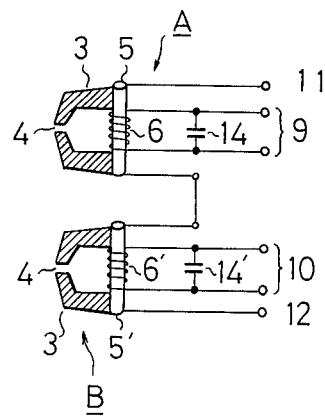

FIG. 1 is a front external view and flat sectional view of the magnetic head of the embodiment and FIG. 2 is an internal circuit diagram of the head.

The operational principle of the magnetic head of this type has been developed by the inventor and others. Many patent and utility-model applications concerning the magnetic head, including Japanese patent application No. 37590/1971 have been filed, and U.S. Pat. No. 3,854,086 has already been obtained.

Referring to FIG. 1, a fine angle (for instance 1°) detection element A and a coarse angle (90°, 120°, etc.) detection element B are contained in a shield housing 1 in which the two elements are separated by a shield plate 2 and positioned so as to be perpendicular 90° to each other. Yokes 3 and 3' made of ferrite have air gaps 4 and 4' at their tips and have the other ends joined to magnetic wires 5 and 5'. The magnetic wires 5 and 5' are provided with coils 6 and 6', from which output terminals 9 and 10 are led out from the detection elements A and B respectively. The magnetic wires 5 and 5' have one of their ends mutually connected and the other of their ends led out to input terminals 11 and 12. All the head components are molded and solidified with resin 13.

The magnetic wires of the elements A and B of the head have the uniaxial magnetic anisotropy with the hard magnetization axis being in the axial direction of the wire and a voltage is induced in the easy magnetization axis being in the circumferential direction of the wire, and the coils wound on the wires when an external magnetic field is applied to the elements in the hard magnetization axial direction. Thus the detector head detects the presence of an external magnetic field by means of the voltage induced in the coils.

Figure 3:
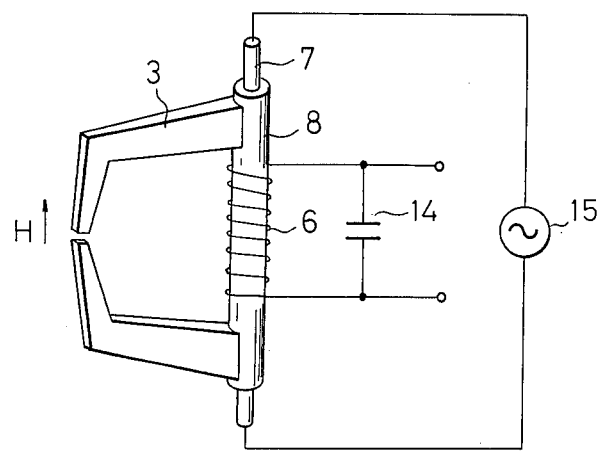
FIG. 3 shows the construction of a magnetic detection element of the magnetic head.

Further detailed description of the elements will be made by referring to FIG. 3 which illustrates the fine angle detection element. In FIG. 3, a core conductor 7 of phosphor bronze or other material is plated with a permalloy thin-film 8 about 1 μ thick. A coil 6 is wound around the plated conductor, and a capacitor 14 is connected in parallel with the coil. A pair of yokes 3 made of ferrite is provided on the permalloy thin-film so as to interpose the coil between them and to form an air gap between the tips of the yokes. While the core conductor 7 of a magnetic element thus composed is supplied with AC current of frequency $f$ from an input power source 15, an output voltage whose frequency is twice $2f$ as high as that of the input voltage from the input power source 15 is induced at the output terminals 9 of the coil 6 only when an external magnetic field is applied through the ferrite yokes 3 to the permalloy thin-film 8 in the axial direction of the core wire, that is, the hard magnetization axial direction. A capacitor 14 is connected in parallel with the coil 6 to form a resonance circuit together with the coil. The construction of the coarse angle detection element is identical to what is described above.

The example of the numerical design of the above head is: the diameter of the core conductor is 0.2 mm; the thickness of the thin film is 1 μ; the number of turns of the coil is 60; a current flowed in the wire is 70 mA; the input frequency $f$ is 1 MHz, and; the output frequency $2f$ is 2 MHz. With the above numerical conditions, if an appropriate capacitance 14 is introduced, an amplitude of an output voltage of frequency $2f$ can be 0.3 volt.

Figure 4:
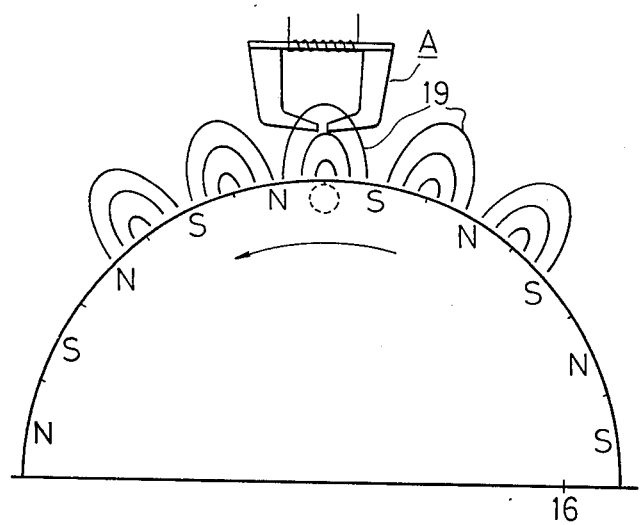
FIG. 4 shows the relative positions of magnetic detection elements and magnetic poles.
Figure 4:
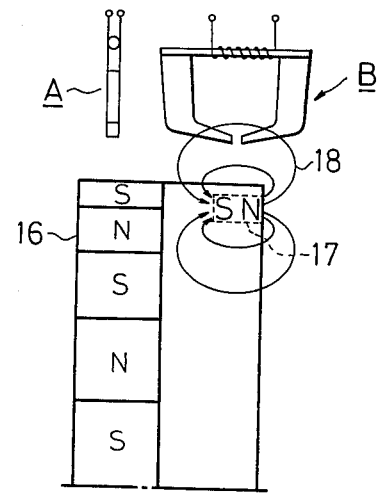
Figure 5:
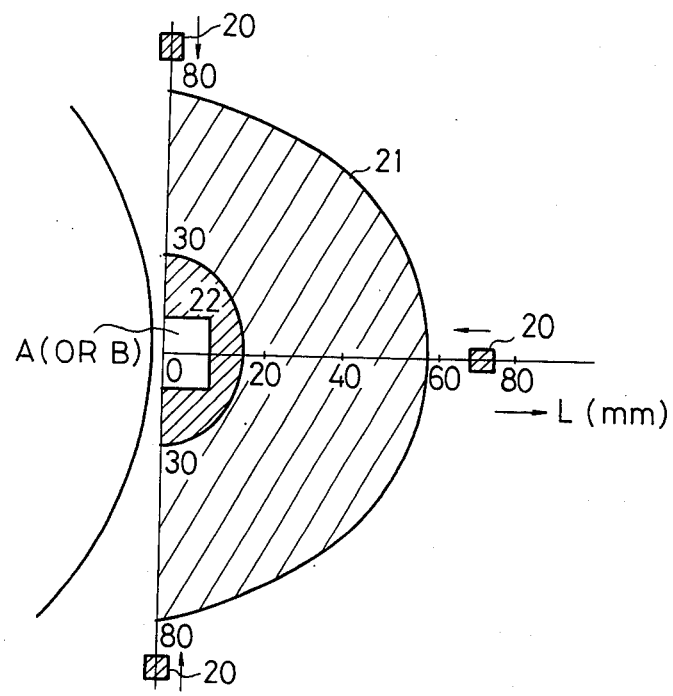
FIG. 5 is a drawing for the explanation of the effect of shield case.

The magnetic elements described above are used for detecting the leakage magnetic fields of a multipolar magnetized disk 16 and the magnets 17 in a disk along the circumference, respectively. (as shown in FIG. 4). It should be noted that the fine angle detection element A and coarse angle detection element B are fixed perpendicular to each other as shown in FIG. 1. This is so that the fine angle detection element A may be unaffected by the leakage magnetic fields 18 of the coarse angle magnets 17 and that the coarse angle detection element B may also be unaffected by the leakage magnetic fields 19 of the fine angle detection magnetic pole as shown in FIG. 4. Further, both the magnetic elements are enclosed in a magnetic shield case or housing so that the elements may be unaffected by the leakage magnetic fields of the electrical equipment around them. An experiment conducted by the inventor has shown that the effect of the shield case is remarkable. The experiment was performed by moving a test magnet 20 in FIG. 5, which had a size of 10×3×10 mm and a surface magnetic flux of 2 kilogauss, in the arrow direction of FIG. 5. The result is shown in FIG. 5, in which the hatched area 21 represents the on-operation region of the detection element without the shield case and the hatched area 22 represents that of the element with the shield case. The results shows a remarkable difference between the two elements. As the experimental results show, by containing the magnetic detection elements in a shield case made of permalloy, their functions can be held normal and they are unaffected by a strong external magnetic-field source, such as alternator, motor, electromagnetic clutch, located nearly.

Figure 6:
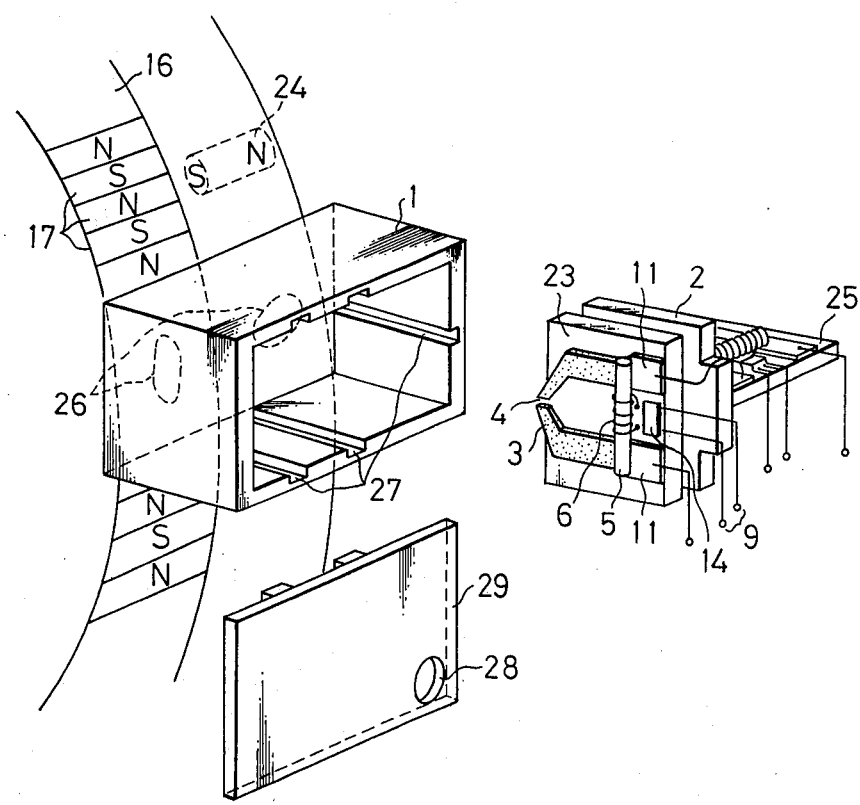
FIG. 6 shows perspective views illustrating the construction of the magnetic head.

FIG. 6 shows the construction of the magnetic head of the embodiment according to the present invention. On one side of an insulating board 23, input terminals 11 and output terminals 9 are printed. A capacitor 14 is fixed between the output terminals 9, a magnetic wire 5 having a coil 6 connected to the output terminals 9 is connected between the input terminals 11 and ferrite yokes 3 are fixed on the board 23 at both ends of the magnetic wire 5 so as to form a narrow air gap 4, for thereby composing a fine angle detection element A. On another board 25 which is positioned so as to be perpendicular to the board 23, with a magnetic shield plate 2 interposed between the boards, a coarse angle detection element B of the same construction as A described above is composed. This composition is inserted into a shield case 1 by fitting the boards and plate in the grooves 27 provided in the case so that the gaps 4 and 4' of the yokes may be positioned in the holes 26 made in the front of the shield case so as to be opposite to the magnetic poles of the disk 16 and the coarse angle detecting magnets 24, respectively. The empty spaces in the shield case are filled with resin hardened there, and finally the rear of the case is covered with a shield plate 29 having a hole 28 through which lead wires are led out of the case.

From the above explanation, it will be clear to those skilled in the art that the coil of the element A provides the fine angle information by the on/off signal of frequency $2f$, and the coil of the element B provides the coarse angle information by the on/off signal of frequency $2f$. The former (fine angle information) shows the rotational angle of a rotary body and the latter (coarse angle information) shows the number of rotations of a rotary body.

Although the invention has been described by taking up an embodiment in which the fine angle detection element A and the coarse angle detection element B are perpendicular to each other, the detection elements may alternatively be arranged parallel to each other.

As described in the foregoing, an apparatus of the present invention to detect the rotational angle and the number of rotations of a rotary body has the advantages of being very simple in construction, excellent in external impact resistance and low in production cost, as well as yielding an output voltage of constant level regardless of the speed of revolution of a crank-shaft or other rotary body. The present invention therefore provides a highly effective means for detecting the angle of rotation and speed of revolution of, for example, crankshafts, necessary for operation of electronic spark advancers, electronic fuel injectors and electronic misfire detectors.

From the foregoing it will now be apparent that a new and improved apparatus for the detection of the rotational angle and the number of rotations has been found. It should be understood, of course, that the embodiment disclosed is only illustrative and is not intended to limit the scope of the invention. Reference should be made, therefore, to the appended claims rather than the specification as indicating the scope of the invention.

Finally, the important reference symbols and the numerals described in this specification are as follows.

A: One-degree angle detection element
B: Reference angle detection element
1: Shield case
2: Shield plate
3: Yoke made of ferrite
4: Magnetic gap
5: Magnetic wire
6: Induction coil
9 and 10: Output terminals
11 and 12: Input terminals
16: Multi-polar magnetized disk for one-degree angle detection 17: Small magnet for reference angle detection

What is claimed is:

1. Apparatus for detecting the rotational angle and the number of rotations of a rotary body, comprising:

a housing of magnetic shield material;

a magnetic shield plate dividing said housing into two compartments;

a first insulating board disposed in one of said compartments parallel to said shield plate;

a second insulating board disposed in the other compartment perpendicular to said shield plate;

a pair of input terminals and a pair of output terminals disposed on each of said boards;

a magnetic yoke affixed to each of said boards, each yoke comprising a pair of ferrite poles pieces having a relatively narrow air gap therebetween adjacent a given edge of the corresponding board and a relatively wide separation therebetween in a region remote from said air gap, and a wire having a layer of magnetic material exhibiting uni-axial magnetic anisotropic characteristics plated thereon, said layer having a hard magnetization axis in the axial direction of said wire, and an easy magnetization axis in the circumferential direction of said wire, said wire being connected between said pole pieces at said remote region, a coil wound on said wire, the ends of said coil being electrically connected across the corresponding pair of output terminals;

a capacitor on said board having its terminals electrically connected across the corresponding pair of output terminals;

means electrically connecting the ends of each wire across the corresponding pair of input terminals;

means for applying an alternating current signal having a predetermined frequency to each pair of input terminals;

said given edges of said boards being disposed adjacent a given surface of said housing, said housing having apertures in said surface, an aperture therein communicating with each compartment, each of said boards being positioned so that the ends of the corresponding pole pieces forming said air gaps extend into said apertures;

first and second juxtaposed parallel coaxial rotary disks comprising magnetized magnetic material;

means for securing said disks to said rotary body for rotation therewith about the axis of said disks;

the periphery of each disk having alternating N and S magnetic poles disposed thereon, the number of magnetic poles on the periphery of one disk being substantially greater than the number of magnetic poles on the periphery of the other disk;

said disks being disposed adjacent said given surface of housing so that each of said air gaps is adjacent the periphery of a corresponding disk, whereby one of said pair of output terminals provides a signal of twice said predetermined frequency for predetermined increment of rotation of said body, and the other pair of output terminals provides another signal of twice said predetermined frequency for each substantially greater increment of rotation of said body.

* * * * *

UNITED STATES PATENT OFFICE
CERTIFICATE OF CORRECTION

Patent No. 4,053,826　　　　　　　　　Dated October 11, 1977

Inventor(s) Kiyoshi Wasawa, et al

It is certified that error appears in the above-identified patent and that said Letters Patent are hereby corrected as shown below:

Column 2, line 59: Delete "a voltage is induced in".

line 61: Insert --a voltage is induced in-- after "and".

Signed and Sealed this

Fourteenth Day of March 1978

[SEAL]

Attest:

RUTH C. MASON　　　　　　LUTRELLE F. PARKER
Attesting Officer　　　　Acting Commissioner of Patents and Trademarks